US010297796B2

United States Patent
Ren et al.

(10) Patent No.: US 10,297,796 B2
(45) Date of Patent: May 21, 2019

(54) METHOD OF MANUFACTURING OLED ELEMENT AND AN OLED ELEMENT

(71) Applicant: Wuhan China Star Optoelectronics Semiconductor Display Technology Co., Ltd., Wuhan, Hubei (CN)

(72) Inventors: Hongyang Ren, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/743,396

(22) PCT Filed: Nov. 14, 2017

(86) PCT No.: PCT/CN2017/110777
§ 371 (c)(1),
(2) Date: Jan. 10, 2018

(65) Prior Publication Data
US 2019/0115565 A1     Apr. 18, 2019

(30) Foreign Application Priority Data
Oct. 18, 2017  (CN) .......................... 2017 1 0972251

(51) Int. Cl.
*H01L 51/56*     (2006.01)
*H01L 51/00*     (2006.01)
*H01L 51/50*     (2006.01)

(52) U.S. Cl.
CPC .......... *H01L 51/56* (2013.01); *H01L 51/0018* (2013.01); *H01L 51/504* (2013.01)

(58) Field of Classification Search
CPC .... H01L 51/56; H01L 51/504; H01L 51/0018
USPC ............................................................ 257/40
See application file for complete search history.

(56) References Cited

U.S. PATENT DOCUMENTS

| | | | |
|---|---|---|---|
| 2014/0203245 A1* | 7/2014 | Gupta | H01L 51/5203 257/40 |
| 2017/0104035 A1* | 4/2017 | Lee | H01L 51/5265 |
| 2017/0133631 A1* | 5/2017 | Thompson | H01L 51/5044 |

FOREIGN PATENT DOCUMENTS

CN          103000639 A        3/2013

* cited by examiner

*Primary Examiner* — Fernando L Toledo
*Assistant Examiner* — Adam S Bowen
(74) *Attorney, Agent, or Firm* — Hauptman Ham, LLP

(57) ABSTRACT

An OLED element and a method of manufacturing thereof are provided. The method of manufacturing OLED element includes step S1, sequentially depositing a hole injection layer, a hole transport layer, an emission layer, an electron transport layer and an electron injection layer and a first cathode on an anode; step S2, forming sub-pixels corresponding to each of the emission layers and an organic material layer for adjusting microcavity effect by photolithography; step S3, depositing a second cathode on the organic material layer. The disclosure provides a manufacture which adds conducting organic material layer between two cathodes by photolithography which is not effect to OLED material. According to adjust thickness of layer to enhance microcavity effect, the photolithography is different than the photolithography of manufacture CF and anode, it doesn't need fine metal mask, which save cost and time of manufacture OLED and enhance process efficiency.

8 Claims, 3 Drawing Sheets

METHOD OF MANUFACTURING OLED ELEMENT AND AN OLED ELEMENT

RELATED APPLICATIONS

The present application is a National Phase of International Application Number PCT/CN2017/110777, filed Nov. 14, 2017, and claims the priority of China Application No. 201710972251.X, filed Oct. 18, 2017.

FIELD OF THE DISCLOSURE

The disclosure relates to a panel display technical field, and more particularly to a method of manufacturing OLED element and an OLED element.

BACKGROUND

An OLED (organic light-emitting diode) device can emit light by itself through an organic layer, because the OLED device does not need a back light, the OLED device has a faster response time and a greater viewing angle. Besides, the OLED device also has the advantages of higher contrast, lighter weight, low power consumption, and the OLED device is considered as the panel display device with the greatest development potential.

OLED is formed by multiple layers for different functions. There is very important of original property and compatible property for each of material. In multiple structure, usually includes a hole injection layer (HIL), a hole transport layer (HTL), an emission layer (EML), an electron transport layer (ETL) and an electron injection layer (EIL) and so on. Please refer to FIG. 1, based on a multi-color OLED has red, green, blue three colors which could adjust different thickness layer of different layers for adjusting microcavity effect of OLED element and achieve to enhance light emission efficiency and narrow the spectral width of each color. For example, adjusting thickness of hole transport layer (HTL) of red/green/blue colors to adjust spectral width of these three color for balance color effect. In this design, HTL could not be deposited as common layer, it needs to add a process for using fine metal mask. It will increase time of manufacture and enhance cost of OLED according to the problem of wash fine metal mask. And, also induce alignment issue while using fine metal mask which decrease successful rate of OLED.

SUMMARY

A technical problem to be solved by the disclosure is to provide a method of manufacturing OLED element and an OLED element. It not only could enhance microcavity effect, but also could reduce to use fine metal mask.

An objective of the disclosure is achieved by following embodiments. In particular, a method of manufacturing OLED element, comprising step S1, sequentially depositing a hole injection layer, a hole transport layer, an emission layer, an electron transport layer and an electron injection layer and a first cathode on an anode;

step S2, forming an organic material layer corresponding to each of sub-pixels of the emission layers so as to adjust microcavity effect by photolithography;

step S3, depositing a second cathode on the organic material layer.

In an embodiment, the specifically step S2 comprising step S21, coating a negative photoresist compatible with organic material on the first cathode;

step S22, positioning a photo mask on correspondingly position of the sub-pixel of emission layer, exposing to developing the negative photoresist by the photo mask;

step S23, depositing the organic material layer for adjusting microcavity effect on position of the negative photoresist which is washed away by the developer solution and a remaining negative photoresist;

step S24, peeling the remaining negative photoresist and the organic material layer positioned above thereon, and obtaining a remaining organic material layer is corresponding to the sub-pixel of the emission layer;

step S25, repeating the steps S21-S24 until obtaining the organic material layer which corresponding to each of the sub-pixels of the emission layer.

In an embodiment, the negative photoresist contains carbon chain structure having at least a fluoro-containing group.

In an embodiment, the negative photoresist comprising photosensitive components, the photosensitive components include halogen-containing solvent, photoacid generator compound, at least a monomer contains fluoro-containing group and at least a copolymer contains acid-hydrolyzable ester-containing group.

In an embodiment, halogen reagent is hydrofluoroether or segregated hydrofluoroether, the copolymer is random copolymer.

According to another aspect of the disclosure, the disclosure further provides an OLED element, comprising an anode, and a hole injection layer, a hole transport layer, an emission layer, an electron transport layer and an electron injection layer and a first cathode are sequentially deposited on the anode;

forming an organic material layer corresponding to each of sub-pixels of the emission layer so as to adjust microcavity effect on the first cathode by photolithography; and a second cathode is deposited on the organic material layer.

In an embodiment, the organic material layer is formed by following process positioning a photo mask on correspondingly position of the sub-pixel of emission layer, exposing to developing the negative photoresist by the photo mask;

depositing the organic material layer for adjusting microcavity effect on position of the negative photoresist which is washed away by the developer solution and a remaining negative photoresist;

peeling the remaining negative photoresist and the organic material layer positioned above thereon, and obtaining a remaining organic material layer is corresponding to the sub-pixel of the emission layer; and repeating the above steps until obtaining the organic material layer which corresponding to each of the sub-pixels of the emission layer.

In an embodiment, the negative photoresist contains carbon chain structure having at least a fluoro-containing group.

In an embodiment, the negative photoresist comprising photosensitive components, the photosensitive components include halogen-containing solvent, photoacid generator compound, at least a monomer contains fluoro-containing group and at least a copolymer contains acid-hydrolyzable ester-containing group.

In an embodiment, halogen reagent is hydrofluoroether or segregated hydrofluoroether, the copolymer is random copolymer.

The present invention provides a manufacture which adds conducting organic material layer between two cathodes by photolithography which is not effect to OLED material. According to adjust thickness of layer to enhance microcavity effect, the photolithography is different than the photolithography of manufacture CF and anode, it doesn't need fine metal mask, which save cost and time of manufacture OLED and enhance process efficiency.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

The history of photolithography technology has been more than 200 years, the technology and apparatus are mature and having prefect manufacture process. The applied material (photoresist and developer solution) of photolithography is cheap. The invention directly arrange different thickness of the organic material layer (MCL) on the cathode of OLED by photolithography to achieve purpose of adjusts microcavity effect, the photoresist and peeling solvent of the photolithography almost not effect to the OLED material, which does not need fine metal mask FMM and also decrease cost and save time of manufacture process.

Figure 1:
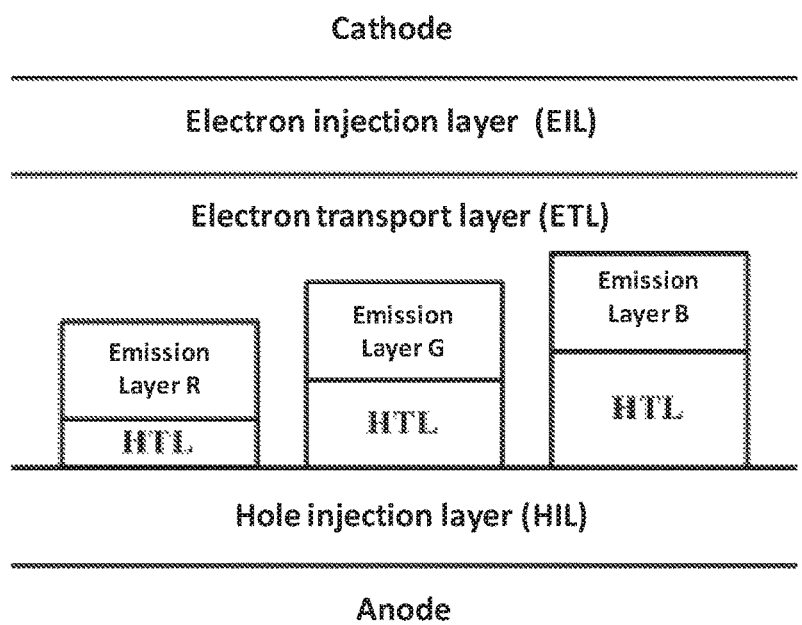
FIG. 1 is a schematic view of adjustment thickness of HTL for adjusting different color's microcavity effect in existing OLED element.
Figure 2:
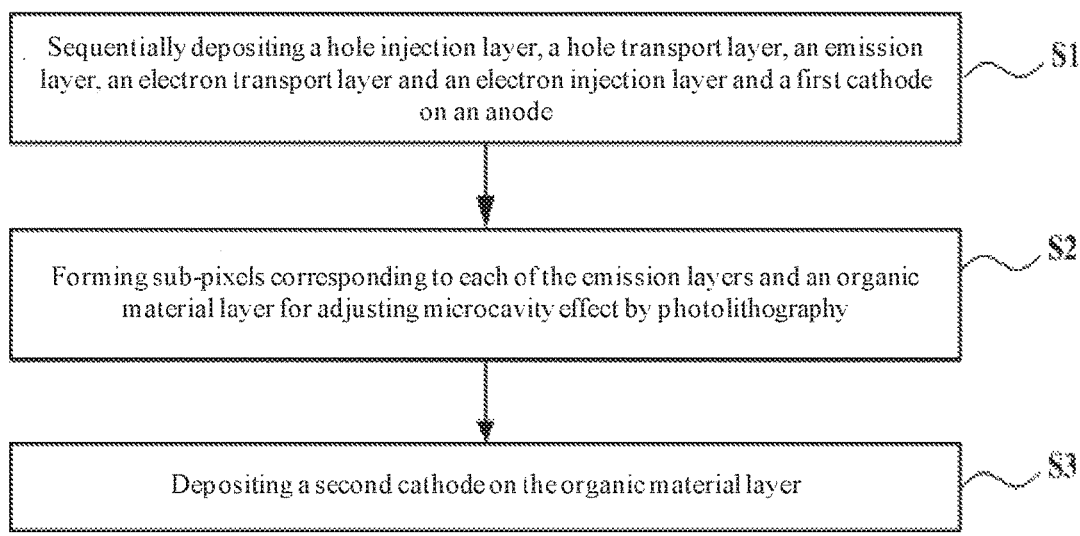
FIG. 2 is a flow chart schematic view of a method of manufacturing OLED element according to an embodiment 1 of the disclosure.

Please refer to FIG. 2. A method of manufacturing OLED element of the embodiment 1 in this present invention comprising:

step S1, sequentially depositing a hole injection layer, a hole transport layer, an emission layer, an electron transport layer and an electron injection layer and a first cathode on an anode;

step S2, forming an organic material layer corresponding to each of sub-pixels of the emission layers so as to adjust microcavity effect by photolithography;

step S3, depositing a second cathode on the organic material layer.

Specifically, in this embodiment, step S1 is actually relative to traditional manufacture of OLED element, and only using fine metal mask for depositing the emission layer EML, and other layers are deposited as common layers.

Further, the specifically step S2 comprising step S21, coating a negative photoresist compatible with organic material on the first cathode;

step S22, positioning a photo mask on correspondingly position of the sub-pixel of the emission layer, exposing to developing the negative photoresist by the photo mask;

step S23, depositing the organic material layer for adjusting microcavity effect on the position of the negative photoresist which is washed away by the developer solution and a remaining negative photoresist;

step S24, peeling the remaining negative photoresist and the organic material layer positioned above thereon, and obtaining a remaining organic material layer is corresponding to the sub-pixel of the emission layer;

step S25, repeating the steps S21-S24 until obtaining the organic material layer which corresponding to each of the sub-pixels of the emission layer.

Figure 3:
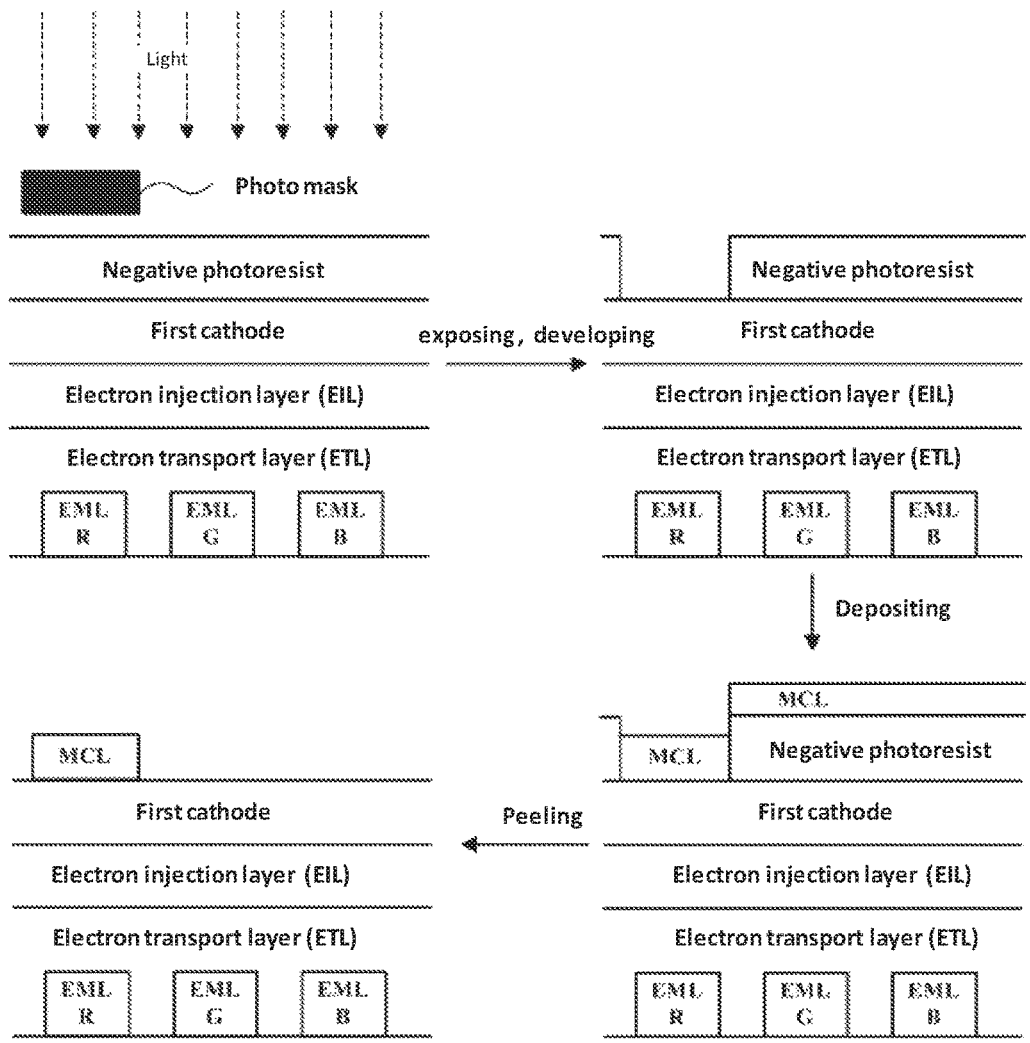
FIG. 3 is a specifically flow chart schematic view of a method of manufacturing OLED element according to the embodiment 1 of the disclosure.

Please refer to FIG. 3. Step S21, coating the negative photoresist and forming a photoresist layer. The negative photoresist is compatible with organic material which without disrupt the properties of organic materials. The photoresist of this invention is different than the photoresist of manufacturing CF and anode, the negative photoresist of this embodiment contains carbon chain structure having at least a fluoro-containing group, for ensuring the negative photoresist without chemical reaction with OLED material when contacting with OLED by photolithography and only reaction with the etching solution. For example, the negative photoresist comprising photosensitive components, the photosensitive components include halogen-containing solvent, photoacid generator compound, at least a monomer contains fluoro-containing group and at least a copolymer contains acid-hydrolyzable ester-containing group. Further, the halogen reagent is hydrofluoroether or segregated hydrofluoroether, the polymer is random copolymer.

And then executing step S22, positioning photo mask on position which corresponding to sub-pixel of emission layer (FIG. 3 illustrated R sub-pixel), which transferring pattern on the photo mask to photoresist layer by UV light. The design of photo mask should be corresponding to the sub-pixel. It noted to that the photo mask is not fine metal mask.

After exposing and development, the negative photoresist which not be exposed is washed away by the developer solution. And then executing S23, depositing the organic material layer (MCL) for adjusting microcavity effect and has better conducting property on position of the negative photoresist which is washed away by the developer solution and a remaining negative photoresist. And then executing S24, peeling the remaining negative photoresist by stripper, the stripper only solving the negative photorsist so that the remaining negative photoresist is solved and peeled, and the organic material layer positioned above thereon is also be peeled. Only the organic material which corresponding to the R sub-pixel of emission layer on display region be leaved, such that the organic material will formed pattern on the indicating position.

Repeat steps S21-S24 above and keeps arrange the organic material layer for adjusting another two color's microcavity effect (G sub-pixel, B sub-pixel), and obtaining different thickness organic material layer which are corresponding to each sub-pixels of emission layer.

Figure 4:
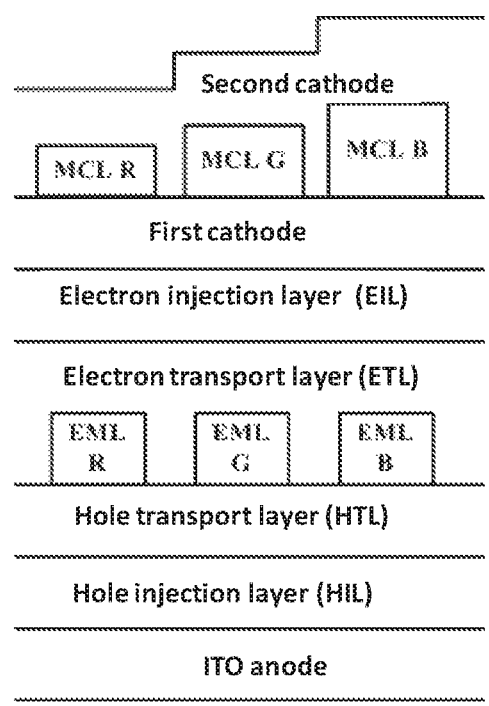
FIG. 4 is a structural schematic view of an OLED element manufacture by a method of manufacturing OLED element according to the embodiment 1 of the disclosure.

At the least step S3, depositing a metal layer on the obtaining each of organic material layers to be a second cathode, and obtaining OLED display element shown as FIG. 4. Please refer to FIG. 4, the OLED display element is different between the existing one, includes a first cathode and a second cathode. The material of second cathode could be as same as the first cathode, or difference, generally the cathode materials will made by magnesium, silver, aluminium or the alloy thereformed.

Comparing to the existing technology which adjusting the different thickness between anode and cathode (need to use fine metal mask) for adjusting microcavity effect, the present invention provides a manufacture which adds conducting organic material layer between two cathodes by photolithography which is not effect to OLED material. According to adjust thickness of layer to enhance microcavity effect, the photolithography is different than the photolithography of manufacture CF and anode, it doesn't need fine metal mask, which save cost and time of manufacture OLED and enhance process efficiency.

According to embodiment 1 of the invention, the embodiment 2 of the present invention provides an OLED element, shown as FIG. 4, comprising an anode, and a hole injection layer, a hole transport layer, an emission layer, an electron transport layer and an electron injection layer and a first cathode are sequentially deposited on the anode;

forming an organic material layer corresponding to each of sub-pixels of the emission layer so as to adjust microcavity effect on the first cathode by photolithography; and a second cathode is deposited on the organic material layer.

Wherein, the organic material layer is formed by the following process positioning a photo mask on correspondingly position of the sub-pixel of emission layer, exposing to developing the negative photoresist by the photo mask;

depositing the organic material layer for adjusting microcavity effect on position of the negative photoresist which is washed away by the developer solution and a remaining negative photoresist;

peeling the remaining negative photoresist and the organic material layer positioned above thereon, and obtaining a remaining organic material layer is corresponding to the sub-pixel of the emission layer; and repeating the above steps until obtaining the organic material layer which corresponding to each of the sub-pixels of the emission layer.

Wherein the negative photoresist contains carbon chain structure having at least a fluoro-containing group.

Wherein the negative photoresist comprising photosensitive components, the photosensitive components include halogen-containing solvent, photoacid generator compound, at least a monomer contains fluoro-containing group and at least a copolymer contains acid-hydrolyzable ester-containing group.

Wherein halogen reagent is hydrofluoroether or segregated hydrofluoroether, the copolymer is random copolymer.

The achievement principle and benefit effect of this embodiment as same as the embodiment 1 of this present invention, here is not repeat again.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of manufacturing OLED element, comprising
step S1, sequentially depositing a hole injection layer, a hole transport layer, an emission layer, an electron transport layer and an electron injection layer and a first cathode on an anode;
step S2, forming an organic material layer corresponding to each of sub-pixels of the emission layers so as to adjust microcavity effect by photolithography;
step S3, depositing a second cathode on the organic material layer;
wherein the specifically step S2 comprising
step S21, coating a negative photoresist compatible with organic material on the first cathode;
step S22, positioning a photo mask on correspondingly position of the sub-pixel of emission layer, exposing to developing the negative photoresist by the photo mask;
step S23, depositing the organic material layer for adjusting microcavity effect on the position of the negative photoresist which is washed away by the developer solution and a remaining negative photoresist;
step S24, peeling the remaining negative photoresist and the organic material layer positioned above thereon, and obtaining a remaining organic material layer is corresponding to the sub-pixel of the emission layer;
step S25, repeating the steps S21-S24 until obtaining the remaining organic material layer which corresponding to each of the sub-pixels of the emission layer.

2. The method of manufacturing OLED element according to claim 1, wherein the negative photoresist contains carbon chain structure having at least a fluoro-containing group.

3. The method of manufacturing OLED element according to claim 1, wherein the negative photoresist comprising photosensitive components, the photosensitive components include halogen-containing solvent, photoacid generator compound, at least a monomer contains fluoro-containing group and at least a copolymer contains acid-hydrolyzable ester-containing group.

4. The method of manufacturing OLED element according to claim 3, wherein halogen reagent is hydrofluoroether or segregated hydrofluoroether, the copolymer is random copolymer.

5. An OLED element, comprising
an anode, and a hole injection layer, a hole transport layer, an emission layer, an electron transport layer and an electron injection layer and a first cathode are sequentially deposited on the anode;
an organic material layer is formed corresponding to each of sub-pixels of the emission layer so as to adjust microcavity effect on the first cathode by photolithography; and
a second cathode is deposited and formed on the organic material layer;
wherein the organic material layer is formed by following process positioning a photo mask on correspondingly position of the sub-pixel of emission layer, exposing to developing a negative photoresist by the photo mask;
depositing the organic material layer for adjusting microcavity effect on position of the negative photoresist which is washed away by the developer solution and a remaining negative photoresist;
peeling the remaining negative photoresist and the organic material layer positioned above thereon, and obtaining the organic material layer is corresponding to the sub-pixel of the emission layer; and repeating the above steps until obtaining the organic material layer which corresponding to each of the sub-pixels of the emission layer.

6. The OLED element according to claim 5, wherein the negative photoresist contains carbon chain structure having at least a fluoro-containing group.

7. The OLED element according to claim 5, wherein the negative photoresist comprising photosensitive components, the photosensitive components include halogen-containing solvent, photoacid generator compound, at least a monomer contains fluoro-containing group and at least a copolymer contains acid-hydrolyzable ester-containing group.

8. The OLED element according to claim 7, wherein halogen reagent is hydrofluoroether or segregated hydrofluoroether, the copolymer is random copolymer.

* * * * *